US009133391B2

(12) United States Patent
Fukuda et al.

(10) Patent No.: US 9,133,391 B2
(45) Date of Patent: *Sep. 15, 2015

(54) LUMINESCENT MATERIAL

(75) Inventors: Yumi Fukuda, Tokyo (JP); Iwao Mitsuishi, Machida (JP); Keiko Albessard, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 449 days.

This patent is subject to a terminal disclaimer.

(21) Appl. No.: 13/601,219

(22) Filed: Aug. 31, 2012

(65) Prior Publication Data

US 2013/0241387 A1    Sep. 19, 2013

(30) Foreign Application Priority Data

Nov. 16, 2011 (JP) ................................. 2011-250599

(51) Int. Cl.
| C09K 11/77 | (2006.01) |
| H01J 1/62 | (2006.01) |
| H01J 63/04 | (2006.01) |
| C09K 11/08 | (2006.01) |
| H05B 33/14 | (2006.01) |

(52) U.S. Cl.
CPC ......... *C09K 11/7718* (2013.01); *C09K 11/0883* (2013.01); *C09K 11/7716* (2013.01); *C09K 11/7721* (2013.01); *H05B 33/14* (2013.01)

(58) Field of Classification Search
CPC ................................................. C09K 11/7721
USPC .................................... 252/301.4 F; 313/503
See application file for complete search history.

(56) References Cited

U.S. PATENT DOCUMENTS

| 7,524,437 | B2 | 4/2009 | Sakane et al. |
| 2006/0197439 | A1 | 9/2006 | Sakane et al. |
| 2006/0244356 | A1 | 11/2006 | Nagatomi et al. |
| 2007/0075629 | A1 | 4/2007 | Le Toquin et al. |
| 2007/0228949 | A1 | 10/2007 | Maruyama et al. |
| 2009/0096361 | A1 | 4/2009 | Fukuda et al. |

(Continued)

FOREIGN PATENT DOCUMENTS

| EP | 1 296 376 A2 | 3/2003 |
| EP | 1 296 376 A3 | 3/2003 |

(Continued)

OTHER PUBLICATIONS

Office Action issued Dec. 23, 2013 in the corresponding Korean Patent Application No. 10-2012-95340 (with English Translation).

(Continued)

*Primary Examiner* — Matthew E Hoban
(74) *Attorney, Agent, or Firm* — Oblon, McClelland, Maier & Neustadt, L.L.P.

(57) ABSTRACT

According to one embodiment, the luminescent material exhibits a luminescence peak in a wavelength ranging from 500 to 600 nm when excited with light having an emission peak in a wavelength ranging from 250 to 500 nm. The luminescent material has a composition represented by Formula 1 below:

$$(M_{1-x}Ce_x)_{2y}Al_zSi_{10-z}O_uN_w \quad \text{Formula 1}$$

wherein M represents Sr and a part of Sr may be substituted by at least one selected from Ba, Ca, and Mg; x, y, z, u, and w satisfy following conditions:
$0<x\leq 1$, $0.8\leq y\leq 1.1$, $2\leq z\leq 3.5$, $u\leq 1$
$1.8\leq z-u$, and $13\leq u+w\leq 15$.

19 Claims, 13 Drawing Sheets

(56) References Cited

U.S. PATENT DOCUMENTS

| | | | |
|---|---|---|---|
| 2009/0267485 A1* | 10/2009 | Nagatomi et al. | 313/503 |
| 2010/0013375 A1 | 1/2010 | Maruyama et al. | |
| 2010/0102707 A1* | 4/2010 | Fukuda et al. | 313/503 |
| 2011/0057149 A1 | 3/2011 | Fukuda et al. | |
| 2011/0058582 A1 | 3/2011 | Fukuda et al. | |
| 2011/0058583 A1 | 3/2011 | Fukuda et al. | |
| 2012/0062103 A1 | 3/2012 | Okada et al. | |
| 2012/0062106 A1 | 3/2012 | Okada et al. | |
| 2014/0084782 A1* | 3/2014 | Fukuda et al. | 313/503 |

FOREIGN PATENT DOCUMENTS

| | | |
|---|---|---|
| EP | 1 296 383 A2 | 3/2003 |
| EP | 1 296 383 A3 | 3/2003 |
| EP | 1930393 A1 | 6/2008 |
| JP | 2006-307090 | 11/2006 |
| TW | 200712177 | 4/2007 |
| WO | 2006/093298 A1 | 9/2006 |
| WO | 2007/037059 A1 | 4/2007 |

OTHER PUBLICATIONS

S. H. M. Poort, et al., "Optical properties of $Eu^{2+}$ -activated orthosilicates and orthophosphates", Journal of Alloys and Compounds, vol. 260, 1997, pp. 93-97.

G. Blasse, et al., "Fluorescence of $Eu^{2+}$ -Activated Silicates", Philips Res. Repts, vol. 23, 1968, pp. 189-200.

Theo Hahn, "International Tables for Crystallography" Space-Group Symmetry, vol. A, 1983, 4 pages.

U.S. Appl. No. 13/845,554, filed Mar. 18, 2013, Fukuda, et al.

The Extended European Search Report issued May 2, 2013, in Application No. / Patent No. 12182360.3-1355.

Krevel Van, Luminescence properties of rare earth doped α-SiALON Materials (Chapter 11), On new Rare-Earth Doped M—Si—Al—O—N Materials, Jan. 1, 2000, XP008060386, pp. 145-157.

Taiwanese Office Action issued Feb. 20, 2014, in Taiwan Patent Application No. 101131175 (with English Translation).

Combined Chinese Office Action and Search Report issued Jan. 6, 2014 in Patent Application No. 201210315909.7 with English Translation.

U.S. Appl. No. 14/183,743, filed Feb. 19, 2014, Okada, et al.
U.S. Appl. No. 14/184,846, filed Feb. 20, 2014, Fukuda, et al.
U.S. Appl. No. 14/184,890, filed Feb. 20, 2014, Okada, et al.
U.S. Appl. No. 14/187,686, filed Feb. 24, 2014, Fukuda, et al.
U.S. Appl. No. 14/188,877, filed Feb. 25, 2014, Okada, et al.
U.S. Appl. No. 14/193,305, filed Feb. 28, 2014, Albessard, et al.

Office Action issued Feb. 3, 2015 in Japanese Patent Application No. 2011-250599 (with English language translation).

* cited by examiner

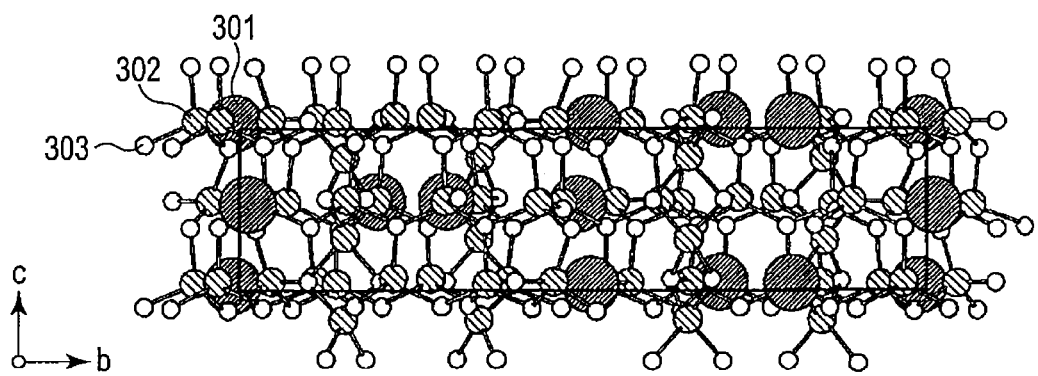
F I G. 1C
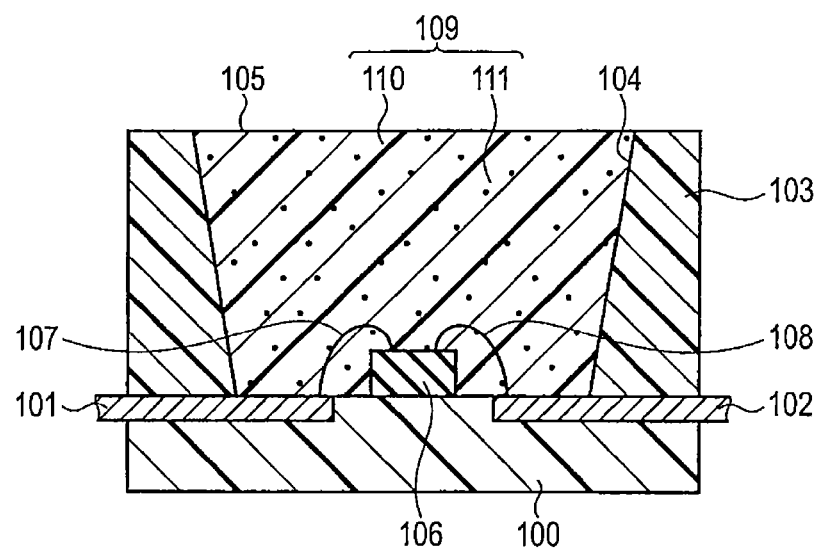
F I G. 2

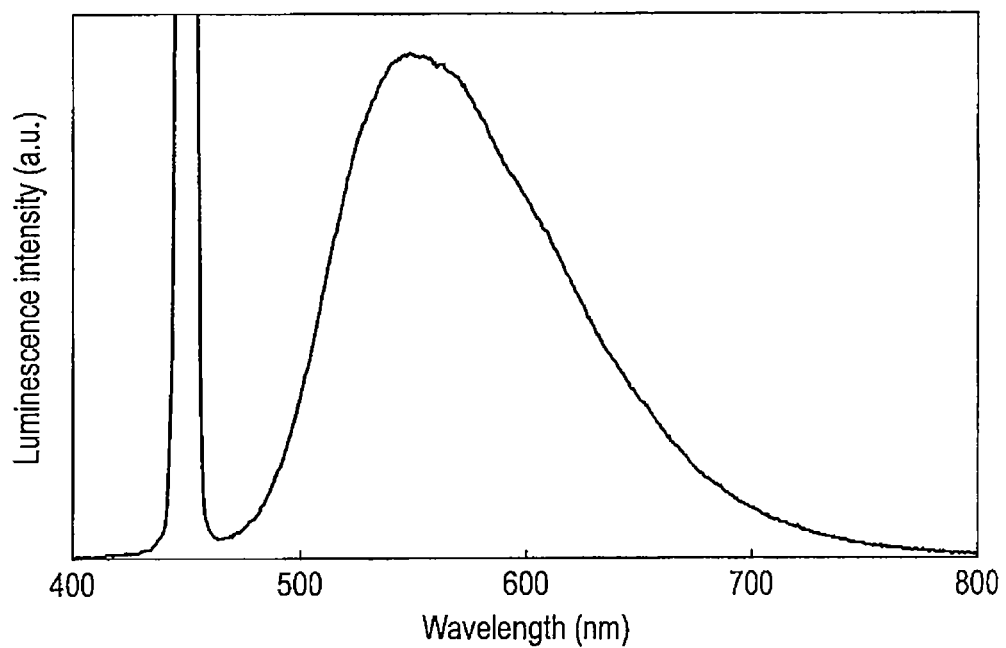
F I G. 5
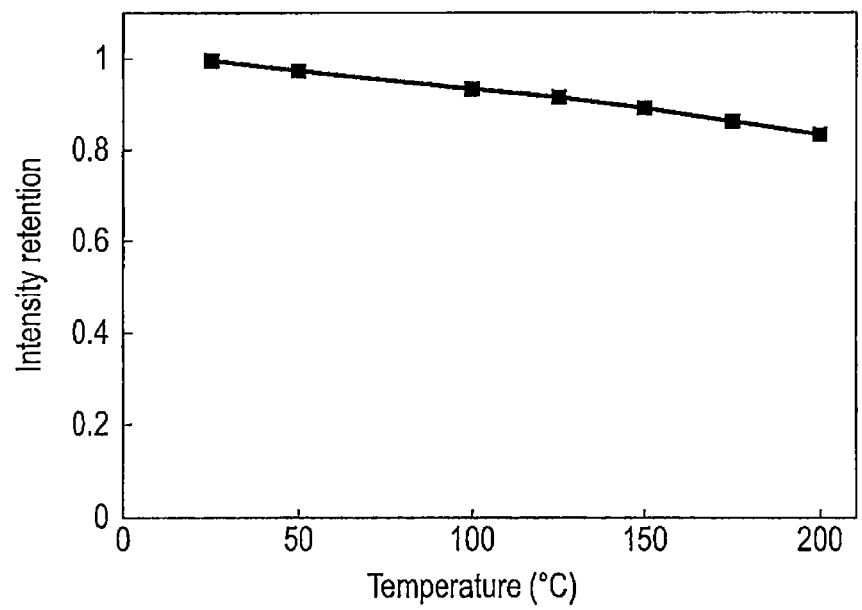
F I G. 6

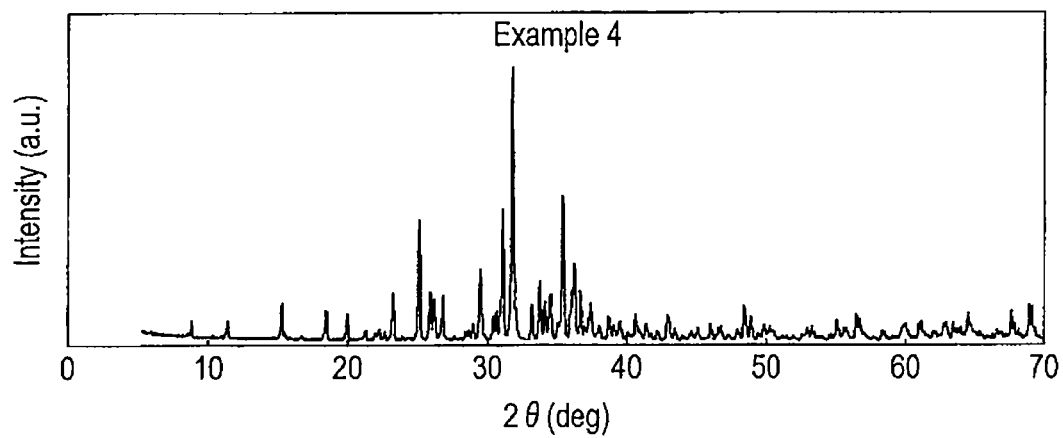
F I G. 9
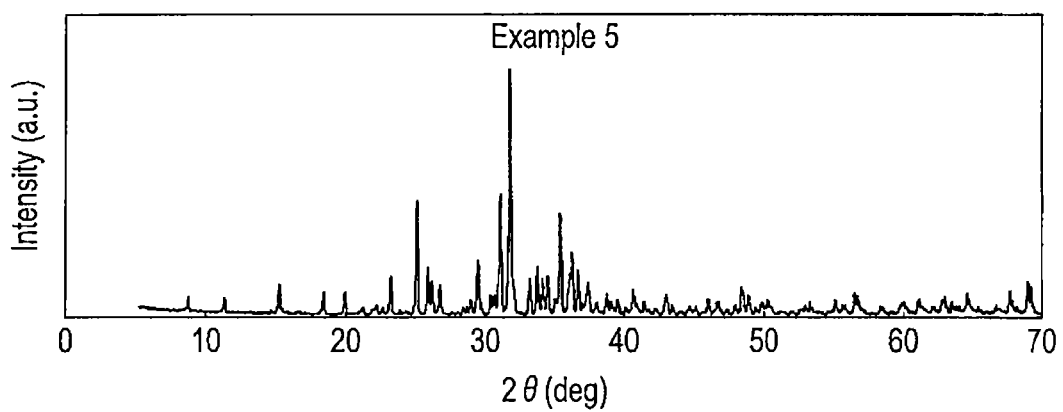
F I G. 10

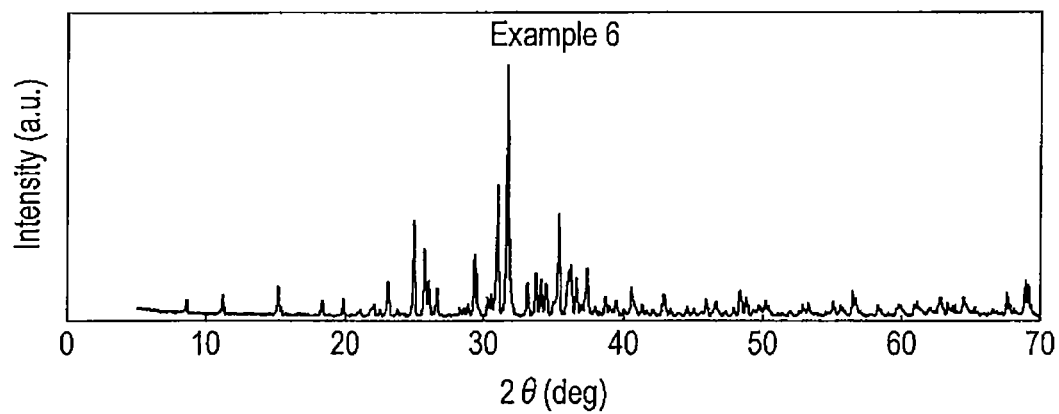
F I G. 11
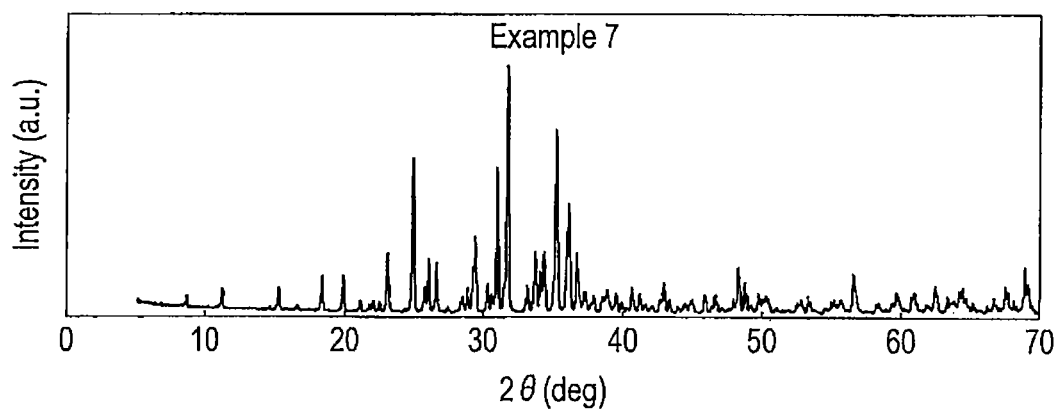
F I G. 12

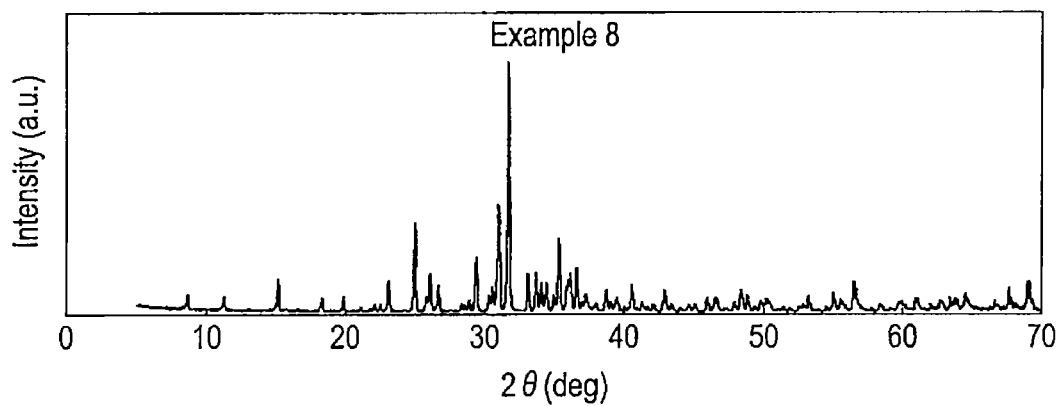
F I G. 13
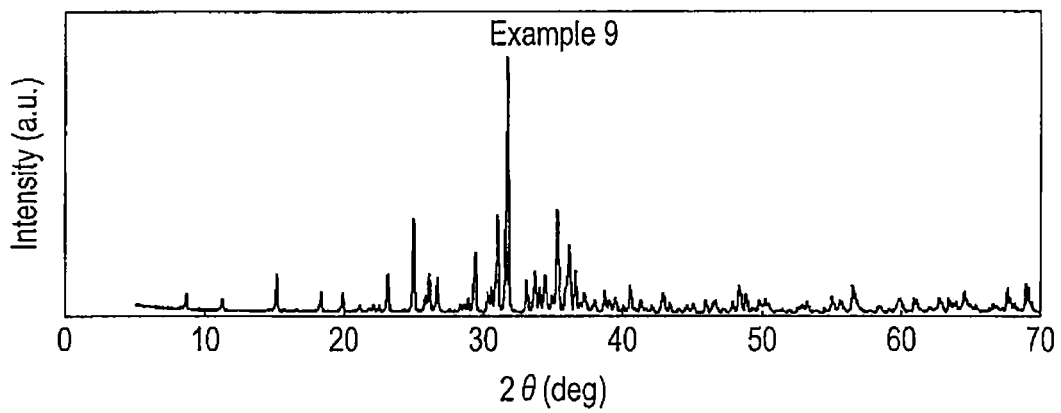
F I G. 14

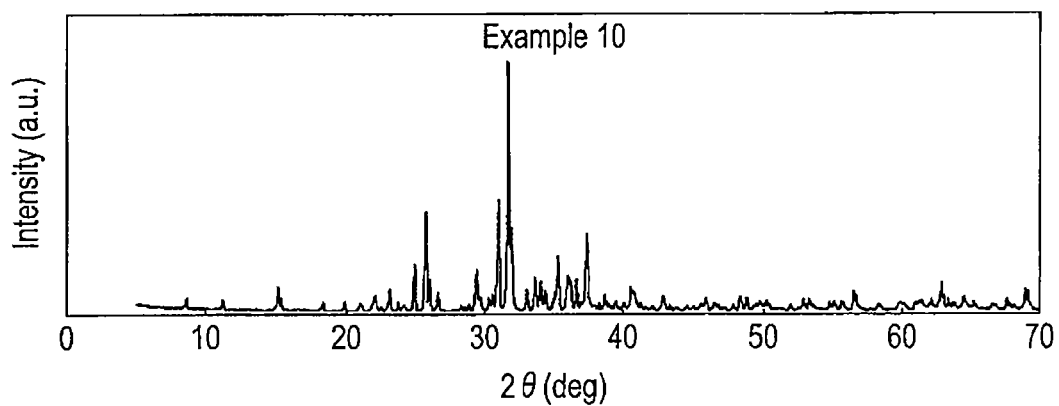
F I G. 15
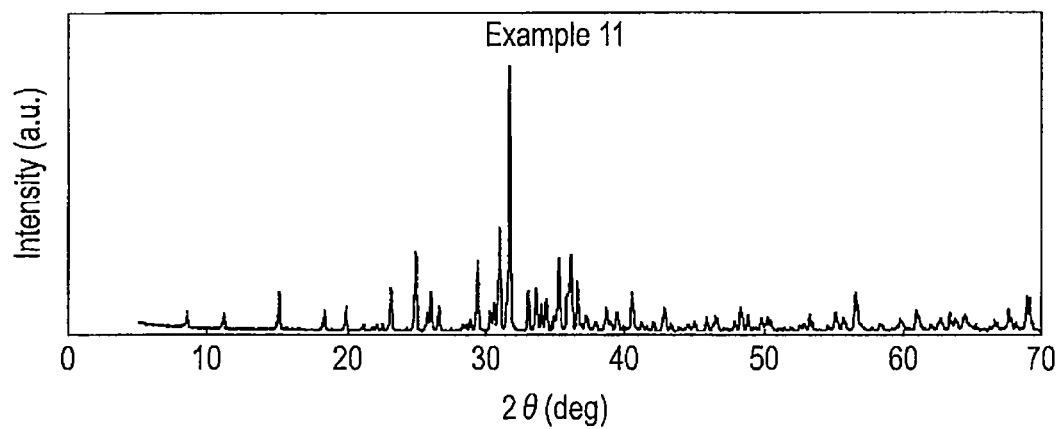
F I G. 16

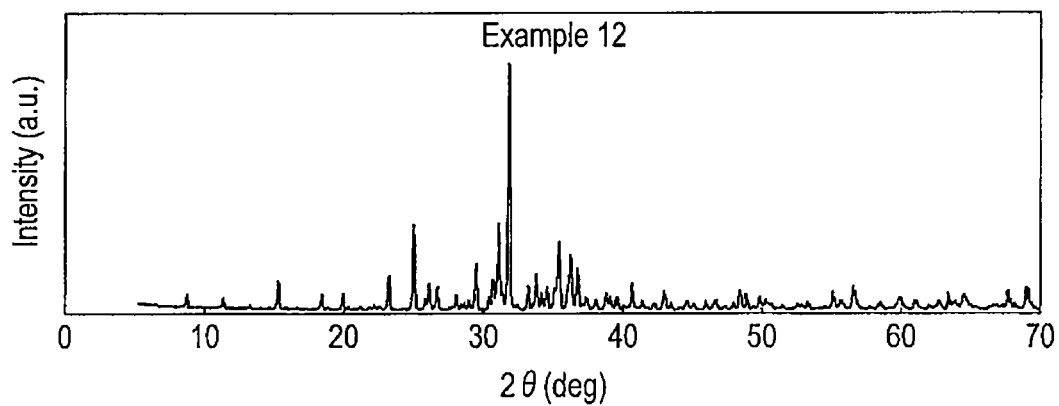
F I G. 17
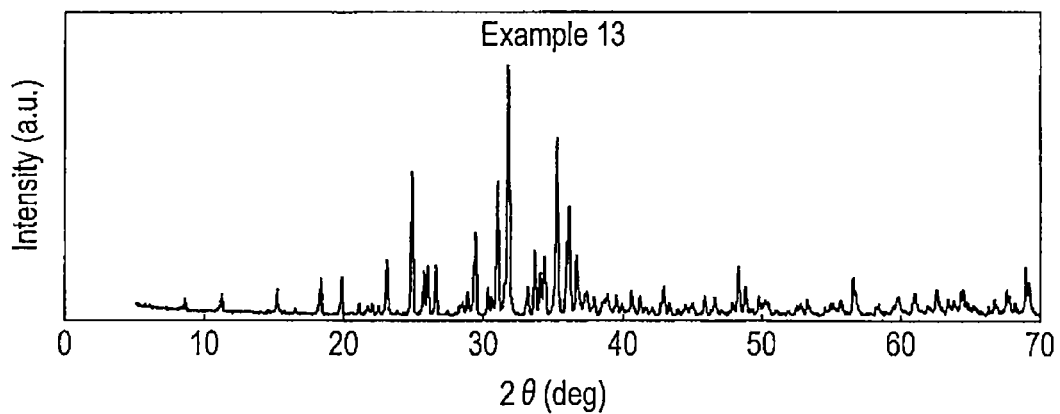
F I G. 18

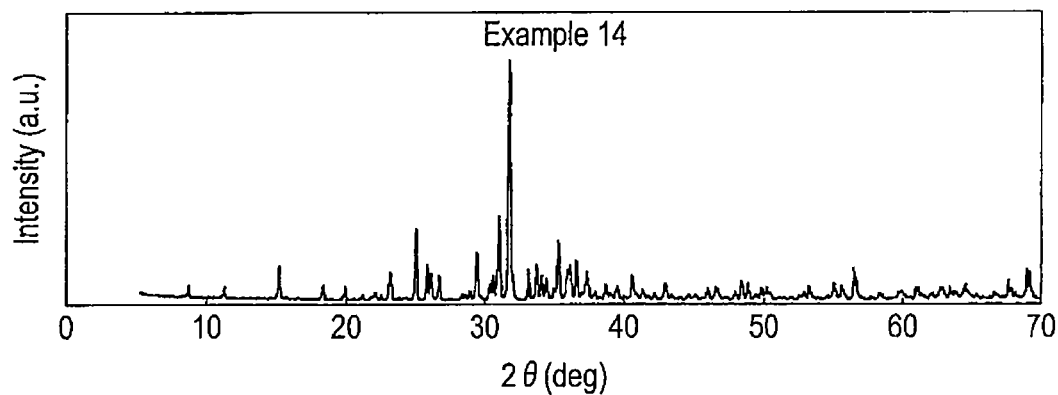
F I G. 19
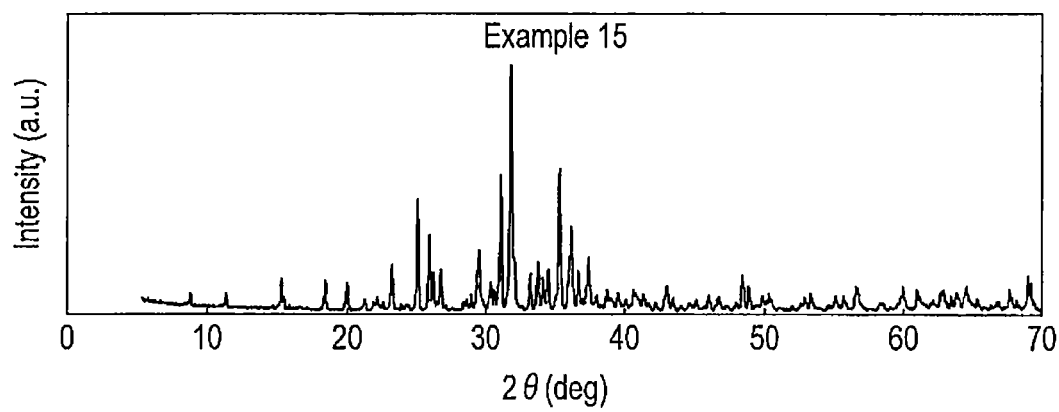
F I G. 20

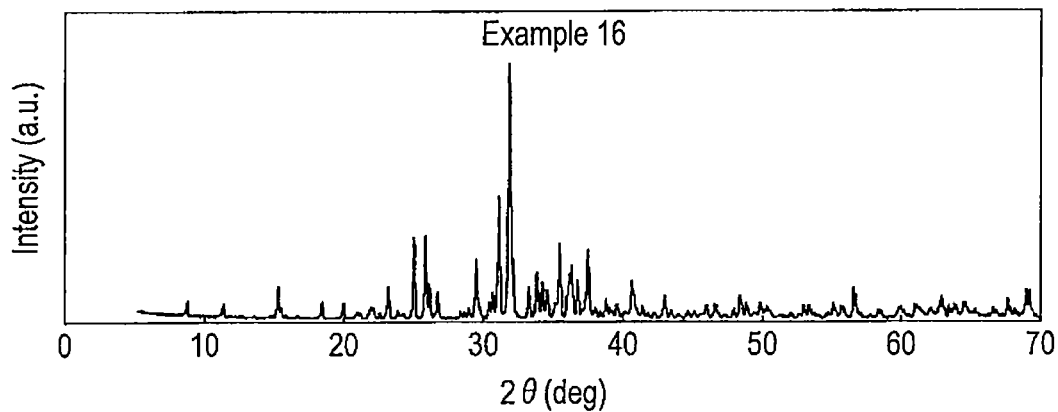
F I G. 21
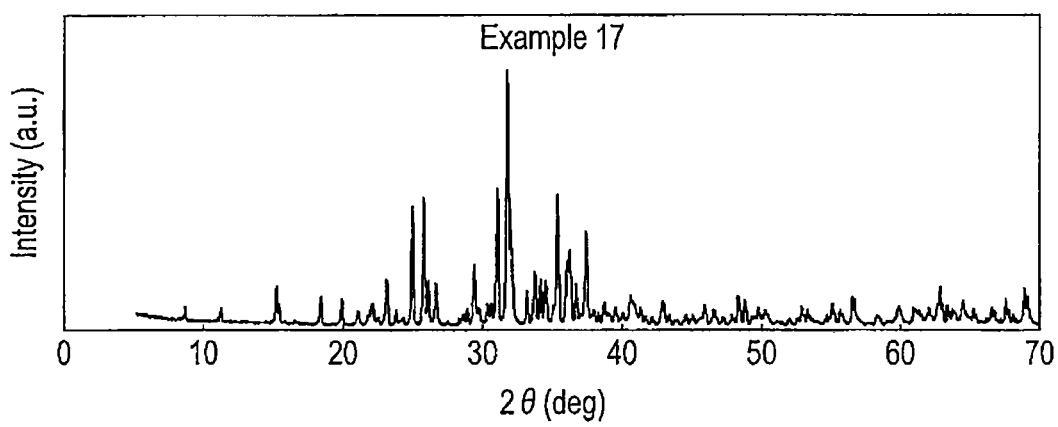
F I G. 22

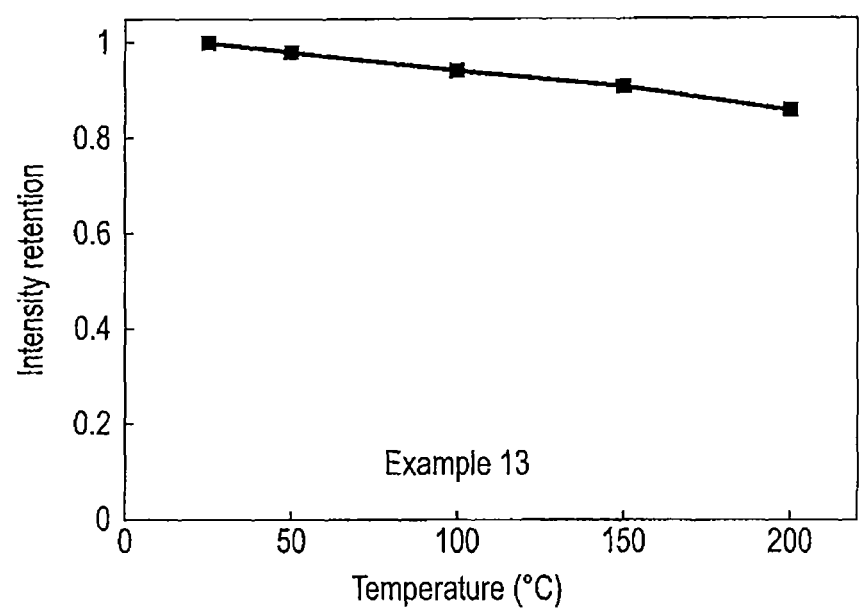
F I G. 23

LUMINESCENT MATERIAL

CROSS-REFERENCE TO RELATED APPLICATIONS

This application is based upon and claims the benefit of priority from Japanese Patent Application No. 2011-250599, filed Nov. 16, 2011, the entire contents of which are incorporated herein by reference.

FIELD

Embodiments described herein relate generally to a luminescent material, a light-emitting device, and a method for manufacturing a luminescent material.

BACKGROUND

A white light-emitting device is configured by combining, for example, a luminescent material which emits red light by excitation with blue light, a luminescent material which emits green light by excitation with blue light, and a blue LED. When a luminescent material which emits yellow light by excitation with blue light is used, the white light-emitting device can be configured by using fewer kinds of luminescent materials. As such a yellow-emitting luminescent material, for example, an Eu-activated orthosilicate luminescent material is known.

There is an increasing need for the yellow-emitting luminescent material to improve temperature property, quantum efficiency, and luminescence emission spectrum half width.

BRIEF DESCRIPTION OF THE DRAWINGS

FIGS. 1A, 1B and 1C are views showing crystal structures of $Sr_2Al_3Si_7ON_{13}$;

FIG. 2 is a schematic view showing the structure of a light-emitting device according to one embodiment;

FIG. 5 is a view showing a luminescence emission spectrum of the luminescent material of Example 1;

FIG. 6 is a view showing temperature property of the luminescent material of Example 1;

FIG. 9 shows an XRD pattern of the luminescent material of Example 4;

FIG. 10 shows an XRD pattern of the luminescent material of Example 5;

FIG. 11 shows an XRD pattern of the luminescent material of Example 6;

FIG. 12 shows an XRD pattern of the luminescent material of Example 7;

FIG. 13 shows an XRD pattern of the luminescent material of Example 8;

FIG. 14 shows an XRD pattern of the luminescent material of Example 9;

FIG. 15 shows an XRD pattern of the luminescent material of Example 10;

FIG. 16 shows an XRD pattern of the luminescent material of Example 11;

FIG. 17 shows an XRD pattern of the luminescent material of Example 12;

FIG. 18 shows an XRD pattern of the luminescent material of Example 13;

FIG. 19 shows an XRD pattern of the luminescent material of Example 14;

FIG. 20 shows an XRD pattern of the luminescent material of Example 15;

FIG. 21 shows an XRD pattern of the luminescent material of Example 16;

FIG. 22 shows an XRD pattern of the luminescent material of Example 17; and

FIG. 23 is a view showing temperature property of the luminescent material of Example 13.

DETAILED DESCRIPTION

Figure 1A:
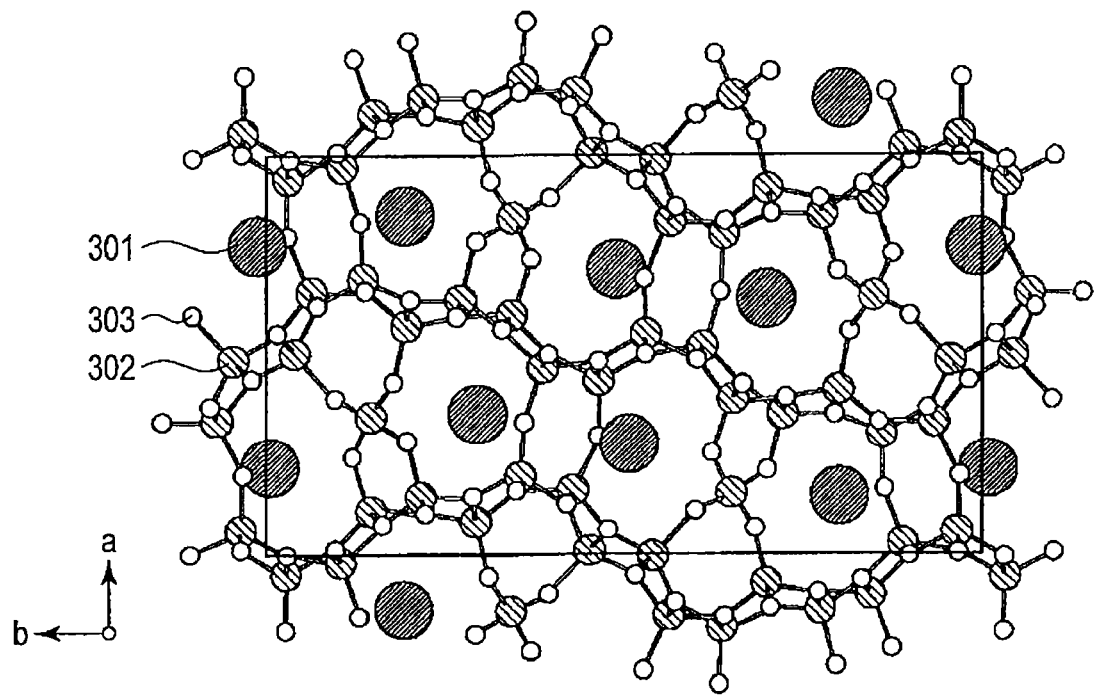

In general, according to one embodiment, a luminescent material exhibits a luminescence peak in a wavelength ranging from 500 to 600 nm when excited with light having an emission peak in a wavelength ranging from 250 to 500 nm, and thus it is a luminescent material capable of emitting light in a yellow-green to orange region. Since the luminescent material of this embodiment mainly emits light in a yellow region, it is hereinafter referred to as "yellow-emitting luminescent material". The luminescent material includes a parent material having a crystal structure which is substantially the same as the crystal structure of $Sr_2Si_7Al_3ON_{13}$. The parent material is activated by Ce. The composition of the yellow-emitting luminescent material according to this embodiment is represented by Formula 1 below.

$$(M_{1-x}Ce_x)_{2y}Al_zSi_{10-z}O_uN_w \qquad \text{Formula 1}$$

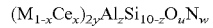

(wherein M represents Sr and a part of the Sr may be substituted by at least one selected from Ba, Ca, and Mg. x, y, z, u, and w satisfy following condition:

$0 < x \leq 1$, $0.8 \leq y \leq 1.1$, $2 \leq z \leq 3.5$, $u \leq 1$ $1.8 \leq z-u$, and $13 \leq u+w \leq 15$)

As shown in Formula 1 above, a luminescence center element Ce substitutes at least a part of the M. M represents Sr and a part of the Sr may be substituted by at least one selected from Ba, Ca, and Mg. Even if at least one selected from Ba, Ca, and Mg is contained at an amount of 15 at. %, more desirably 10 at. % or less based on the total amount of M, generation of a heterophase is not facilitated.

When at least 0.1 mol % of M is substituted by Ce, a sufficient luminous efficiency can be obtained. The total amount of M may be substituted by Ce (x=1). When x is less than 0.5, the reduction in luminous probability (concentration quenching) can be suppressed as much as possible. Therefore, x is preferably from 0.001 to 0.5. When the luminescence center element Ce is contained, the luminescent material of this embodiment exhibits an luminescence in a yellow-green to orange region, namely, an luminescence having a peak in a wavelength ranging from 500 to 600 nm when excited with light having an emission peak in a wavelength range of 250 to 500 nm. In this regard, other elements such as an inevitable impurity are contained at an amount of 15 at. %, more desirably 10 at. % or less based on the total amount of Ce, desired characteristics are not impaired. Examples thereof include Tb, Eu, and Mn.

When y is less than 0.8, crystal defects are increased, which leads to reduction in efficiency. On the other hand, when y exceeds 1.1, an excessive amount of alkaline earth metal is precipitated as a heterophase, which leads to reduction in luminescent property. y is preferably from 0.85 to 1.06.

When z is less than 2, an excessive amount of Si is precipitated as a heterophase, which leads to reduction in luminescent property. On the other hand, when z exceeds 3.5, an excessive amount of Al is precipitated as a heterophase, which leads to reduction in luminescent property. z is preferably from 2.5 to 3.3.

When u exceeds 1, the efficiency is reduced by an increase in crystal defects. u is preferably from 0.001 to 0.8.

When (z−u) is less than 1.8, it becomes impossible to maintain the crystal structure of this embodiment. In some cases, a heterophase is produced and thus an effect of this embodiment is not exerted. When (u+w) is less than 13 or exceeds 15, it becomes similarly impossible to maintain the crystal structure of this embodiment. In some cases, a heterophase is produced and thus an effect of this embodiment is not exerted. (z−u) is preferably 2 or more and (u+w) is preferably from 13.2 to 14.2.

Since the luminescent material according to this embodiment has all the conditions, it can emit yellow light with a wide luminescence emission spectrum half width with high efficiency when excited with light having an emission peak in a wavelength ranging from 250 to 500 nm. Thus, white light excellent in color rendering properties is obtained. Additionally, the yellow-emitting luminescent material according to this embodiment has good temperature property.

The yellow-emitting luminescent material of this embodiment can be obtained by using an $Sr_2Al_3Si_7ON_{13}$ group crystal as a base material, substituting Sr, Si, Al, O or N (constituent elements of the crystal) by other elements, and dissolving other metallic elements such as Ce. The crystal structure may be modified by such substitution. However, the case where the atom position is largely changed to such an extent that the chemical bond between skeletal atoms is cleaved is less often. The atom position is given by the crystal structure, the site accounting for the atom and the coordinates thereof.

The effect of this embodiment can be exerted within a range in which the basic crystal structure of the yellow-emitting luminescent material of this embodiment does not change. The lattice constant and the length of the chemical bond of M-N and M-O (near neighbor interatomic distance) of the luminescent material according to this embodiment may be different from those of $Sr_2Al_3Si_7ON_{13}$. If the variation is less than ±15% of the lattice constant of $Sr_2Al_3Si_7ON_{13}$ and the length of the chemical bond in $Sr_2Al_3Si_7ON_{13}$ (Sr—N and Sr—O), the case is defined as an unchanged crystal structure. The lattice constant can be determined by X-ray diffraction or neutron diffraction, while the length of the chemical bond of M-N and M-O (proximity atomic distance) can be calculated from atomic coordinates.

The crystal of $Sr_2Al_3Si_7ON_{13}$ has a orthorhombic system and its lattice constant is as follows: a=11.8 Å, b=21.6 Å, and c=5.01 Å. Further, the crystal belongs to a space group Pna21. The length of the chemical bond in $Sr_2Al_3Si_7ON_{13}$ (Sr—N and Sr—O) can be calculated from the atomic coordinates shown in Table 1 below.

TABLE 1

| Site | Occupancy ratio | x | y | z |
|---|---|---|---|---|
| Sr1 | 4a | 1 | 0.2786 | 0.49060(11) | 0.5284(14) |
| Sr2 | 4a | 1 | 0.3552(3) | 0.69839(12) | 0.048(2) |
| Si/Al1 | 4a | 1 | 0.3582(9) | 0.2769(3) | 0.070(3) |
| Si/Al2 | 4a | 1 | 0.5782(9) | 0.7996(3) | 0.047(5) |
| Si/Al3 | 4a | 1 | 0.5563(8) | 0.4672(3) | 0.543(5) |
| Si/Al4 | 4a | 1 | 0.4724(8) | 0.6092(3) | 0.556(4) |
| Si/Al5 | 4a | 1 | 0.1910(7) | 0.6397(3) | 0.535(4) |

TABLE 1-continued

| Site | Occupancy ratio | x | y | z |
|---|---|---|---|---|
| Si/Al6 | 4a | 1 | 0.0061(8) | 0.5438(3) | 0.546(4) |
| Si/Al7 | 4a | 1 | 0.1625(9) | 0.5661(3) | 0.038(4) |
| Si/Al8 | 4a | 1 | 0.3937(8) | 0.3469(3) | 0.547(4) |
| Si/Al9 | 4a | 1 | 0.1552(18) | 0.3483(8) | 0.318(3) |
| Si/Al10 | 4a | 1 | 0.1525(14) | 0.3492(6) | 0.813(2) |
| O/N1 | 4a | 1 | 0.436(2) | 0.8164(10) | 0.061(11) |
| O/N2 | 4a | 1 | 0.699(2) | 0.4692(10) | 0.513(10) |
| O/N3 | 4a | 1 | 0.334(2) | 0.6355(10) | 0.511(9) |
| O/N4 | 4a | 1 | 0.213(2) | 0.2980(11) | 0.056(12) |
| O/N5 | 4a | 1 | 0.256(2) | 0.3750(10) | 0.563(9) |
| O/N6 | 4a | 1 | 0.894(2) | 0.6002(12) | 0.549(14) |
| O/N7 | 4a | 1 | 0.358(3) | 0.2062(12) | 0.893(6) |
| O/N8 | 4a | 1 | 0.508(2) | 0.4677(12) | 0.885(6) |
| O/N9 | 4a | 1 | 0.398(2) | 0.2727(12) | 0.392(6) |
| O/N10 | 4a | 1 | 0.430(2) | 0.3336(15) | 0.896(7) |
| O/N11 | 4a | 1 | 0.942(3) | 0.4814(15) | 0.371(8) |
| O/N12 | 4a | 1 | 0.662(2) | 0.8571(12) | 0.893(6) |
| O/N13 | 4a | 1 | 0.128(3) | 0.5743(15) | 0.381(7) |
| O/N14 | 4a | 1 | 0.495(3) | 0.3982(13) | 0.383(6) |

It is essential for the yellow-emitting luminescent material of this embodiment to have such a crystal structure. When the length of the chemical bond changes beyond the range, the chemical bond is cleaved and converted to a different crystal. It is impossible to obtain an effect by the present embodiment.

The yellow-emitting luminescent material of this embodiment includes an inorganic compound having a crystal structure substantially the same as $Sr_2Al_3Si_7ON_{13}$ as a base material and a part of the constituent element M is substituted by the luminescence center ion Ce. The composition of each element is specified within a predetermined range. In this case, the luminescent material exhibits preferable characteristics such as high efficiency, wide luminescence emission spectrum half width, and temperature property.

Figure 1B:
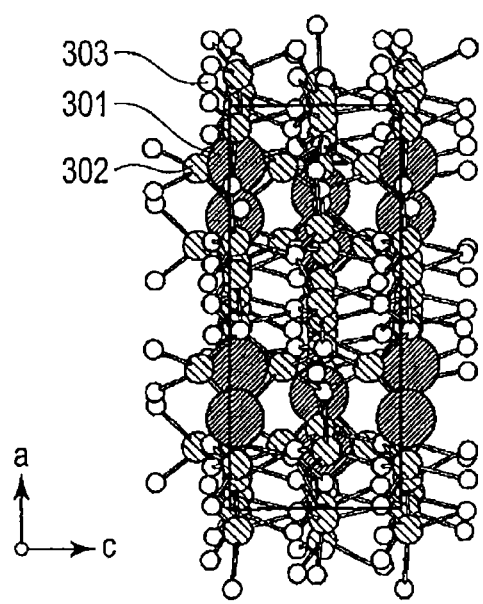

Based on the atomic coordinates shown in Table 1 above, the crystal structure of $Sr_2Al_3Si_7ON_{13}$ is as shown in FIGS. 1A, 1B and 1C. FIG. 1A is a projection view in an axial direction c, FIG. 1B is a projection view in an axial direction b, and FIG. 1C is a projection view in an axial direction a. In the drawings, 301 represents an Sr atom and its circumference is surrounded by an Si atom or an Al atom 302 and an O atom or an N atom 303. The crystal of $Sr_2Al_3Si_7ON_{13}$ can be identified by XRD and neutron diffraction.

The luminescent material of this embodiment has the composition represented by Formula 1 above. The luminescent material has a peak at a specific diffraction angle (2θ) in X-ray diffraction pattern by the Bragg-Brendano method using Cu—Kα line. That is, it has at least ten peaks at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6.

The yellow-emitting luminescent material according to this embodiment can be produced by mixing raw material powder containing each element and heating it.

An M raw material can be selected from nitrides and carbides of M. An Al raw material can be selected from nitrides, oxides, and carbides of Al, and an Si raw material can be selected from nitrides, oxides, and carbides of Si. A raw material of the luminescence center element Ce can be selected from oxides, nitrides, and carbonates of Ce.

In this regard, nitrogen can be obtained by the nitride raw material or heating in an atmosphere containing nitrogen, while oxygen can be obtained from the oxide raw material and the surface-oxidized film of nitride raw materials.

For example, an intended starting composition of $Sr_3N_2$, AlN, $Si_3N_4$, $Al_2O_3$, AlN, and $CeO_2$ is mixed. $Sr_2N$, SrN or mixtures thereof may be used in place of $Sr_3N_2$. In order to obtain a uniform mixed powder, each raw material powder is desirably dry-mixed in order of increasing mass.

The raw material can be mixed using a mortar, for example, in a glove box. The mixed powder is put in a crucible and heated under a predetermined condition to obtain the luminescent material according to this embodiment. The material of the crucible is not particularly limited and the material can be selected from boron nitride, silicon nitride, silicon carbide, carbon, aluminium nitride, sialon, aluminium oxide, molybdenum, and tungsten.

It is desirable that the mixed powder is heated under pressure more than atmospheric pressure. The heating under pressure more than atmospheric pressure is advantageous in terms of the fact that silicon nitride is hardly decomposed. In order to suppress the decomposition of silicon nitride at high temperatures, the pressure is preferably 5 atmospheres or more and the heating temperature is preferably from 1500 to 2000° C. When the heating is performed under such conditions, a target sintered body is obtained without causing any trouble such as sublimation of materials or products. The heating temperature is preferably from 1800 to 2000° C.

In order to avoid oxidation of AlN, the heating is desirably performed in a nitrogen atmosphere. The amount of hydrogen in the atmosphere may be up to about 90 atm. %.

It is preferable that the mixed powder is heated at the above temperature for 0.5 to 4 hours, the sintered material is taken out from the crucible, and cracked and heated under the same conditions again. When a series of processes of taking out, cracking, and heating the powder is repeated about 10 times at most, an advantage such that powder with little fusion between crystal particles and a uniform composition and crystal structure is easily produced.

After heating, post-treatment such as a cleaning process is performed, if necessary to obtain a luminescent material according to one embodiment. As the cleaning process, for example, cleaning with pure water, cleaning with acid or the like can be employed. Usable examples of acid include inorganic acids such as sulfuric acid, nitric acid, hydrochloric acid, and hydrofluoric acid; organic acids such as formic acid, acetic acid, and oxalic acid; and mixed acids thereof.

After the cleaning with acid, post-annealing treatment may be performed, if necessary. The post-annealing treatment can be performed, for example, in a reducing atmosphere containing nitrogen and hydrogen. The crystallinity and the luminous efficiency are improved by performing the post annealing treatment.

A light-emitting device according to one embodiment includes a luminous layer containing the luminescent material and a light-emitting element which excites the luminescent material. FIG. 2 is a schematic view showing the structure of a light-emitting device according to one embodiment.

In the light-emitting device shown in FIG. 2, leads 101 and 102 and a package cup 103 are arranged on a substrate 100. The substrate 100 and the package cup 103 are formed from resin. The package cup 103 has a recess 105 having an upper portion wider than the bottom thereof. The sidewall of the recess serves as a reflective surface 104.

A light-emitting element 106 is mounted on a central portion of the approximately circular bottom of the recess 105 by an Ag paste. The light-emitting element 106 to be used emits light having an emission peak in a wavelength ranging from 400 to 500 nm. Examples thereof include light emitting diodes and laser diodes. Specifically, a semiconductor light emitting element such as a GaN-based LED is used, however, is not particularly limited thereto.

p and n electrodes (not shown) of the light-emitting element 106 are connected, through bonding wires 107 and 108 formed of Au and the like, with the lead 101 and the lead 102, respectively. The arrangement of these leads 101 and 102 may be optionally modified.

As the light-emitting element 106, it is also possible to employ a flip-chip structure in which the n electrode and the p electrode are disposed on the same surface thereof. In this case, it is possible to overcome the problems associated with wiring, such as the cut-off or peeling of wire and the absorption of light by the wire, thereby allowing for the production of a semiconductor light-emitting device which is excellent in reliability and luminance. The following structure can be formed using the light-emitting element having an n-type substrate. An n electrode is formed on the rear surface of the n-type substrate of the light-emitting element and a p electrode is formed on the top surface of a p-type semiconductor layer laminated on the substrate. The n electrode is mounted on the lead and the p electrode is connected with the other lead by wire.

A luminous layer 109 containing a luminescent material 110 according to one embodiment is disposed in the recess 105 of the package cup 103. In the luminous layer 109, for example, 5 to 60% by mass of the luminescent material 110 is contained in a resin layer 111 formed of silicone resin. As described above, the luminescent material according to this embodiment contains $Sr_2Al_3Si_7ON_{13}$ as a parent material. Such oxynitrides have high covalent bonding properties. Thus, the luminescent material according to this embodiment is hydrophobic and has good compatibility with resin. Therefore, scattering at an interface between the resin layer and the luminescent material is significantly suppressed and a light extracting efficiency is improved.

The yellow-emitting luminescent material according to this embodiment has good temperature property and can emit yellow light with a wide luminescence emission spectrum half width with high efficiency. A white light-emitting device excellent in emission property is obtained by combining with the light-emitting element which emits light having an emission peak in a wavelength ranging from 400 to 500 nm.

The size and kind of the light-emitting element 106 as well as the size and shape of the recess 105 may be optionally modified.

The light-emitting device according to one embodiment is not limited to the package cup type shown in FIG. 2 and it may be optionally modified. Specifically, in the case of a bullet-shaped LED or a surface-mounted LED, the luminescent material of the embodiment can be used to obtain the same effect.

Figure 3:
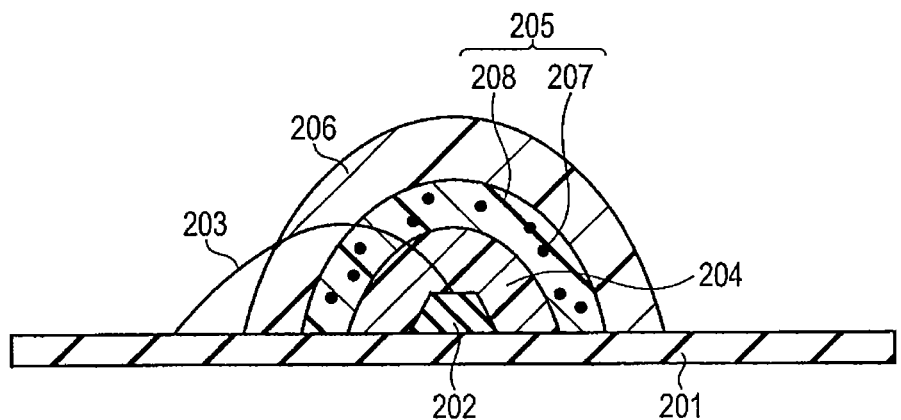
FIG. 3 is a schematic view showing the structure of a light-emitting device according to another embodiment.

FIG. 3 is a schematic view showing the structure of a light-emitting device according to another embodiment. In the shown light-emitting device, p and n electrodes (not shown) are formed in a predetermined region of a heat-dissipative insulation substrate 201, and a light-emitting element 202 is arranged thereon. The quality of material of the heat-dissipative insulation substrate may be, for example, AlN.

One of the electrodes in the light-emitting element 202 is formed on the bottom surface and is electrically connected with the n electrode of the heat-dissipative insulation substrate 201. The other electrode in the light-emitting element 202 is connected, through a gold wire 203, with the p electrode (not shown) on the heat-dissipative insulation substrate 201. As the light-emitting element 202, a light emitting diode which emits light having an emission peak in a wavelength ranging from 400 to 500 nm is used.

A dome-shaped inside transparent resin layer 204, a luminous layer 205, and an outside transparent resin layer 206 are sequentially formed on the light-emitting element 202. The inside transparent resin layer 204 and the outside transparent resin layer 206 can be formed, for example, using silicone. In the luminous layer 205, a yellow-emitting luminescent material 207 of this embodiment is contained in, for example, a resin layer 208 formed of silicone resin.

In the light-emitting device shown in FIG. 3, the luminous layer 205 containing the yellow-emitting luminescent material according to this embodiment can be simply produced by employing procedures such as vacuum printing or drop-coating with a dispenser. Additionally, the luminous layer 205 is sandwiched between the inside transparent resin layer 204 and the outside transparent resin layer 206 and thus an effect of improving extracting efficiency is obtained.

In this regard, the luminous layer of the light-emitting device according to this embodiment may contain a luminescent material which emits green light by excitation with blue light and a luminescent material which emits red light by excitation with blue light together with the yellow-emitting luminescent material of this embodiment. In this case, a white light-emitting device more excellent in color rendering properties is obtained.

Even when the yellow-emitting luminescent material according to this embodiment is excited with light in an ultraviolet region having an emission peak in a wavelength ranging from 250 to 400 nm, yellow emission is obtained. Therefore, the white light-emitting device can be configured by, for example, combining the luminescent material according to this embodiment, a luminescent material which emits blue light by excitation with ultraviolet ray, and a light-emitting element such as an ultraviolet ray emitting diode. The luminous layer in the white light-emitting device may contain a luminescent material which emits light having a peak in another wavelength by excitation with ultraviolet ray together with the yellow-emitting luminescent material of this embodiment. Examples thereof include a luminescent material which emits red light by excitation with ultraviolet ray and a luminescent material which emits green light by excitation with ultraviolet ray.

As described above, the luminescent material of this embodiment has good temperature property and can emit yellow light with a wide luminescence emission spectrum half width with high efficiency. When combining the yellow-emitting luminescent material of this embodiment and a light-emitting element which emits light having an emission peak in a wavelength ranging from 250 to 500 nm, a white light-emitting device excellent in emission property can be obtained using a few kinds of luminescent materials.

Hereinafter, the specific examples of the luminescent material and the light-emitting device will be shown.

$Sr_3N_2$, $CeO_2$, $Si_3N_4$, and AlN were prepared as an Sr raw material, a Ce raw material, an Si raw material, and an Al raw material, and these materials were weighed out in a vacuum glove box. The blending masses of $Sr_3N_2$, $CeO_2$, $Si_3N_4$, and AlN were 2.680 g, 0.147 g, 5.086 g, and 1.691 g, respectively. The blended raw material powder was dry-blended in an agate mortar.

The obtained mixture was put in a boron nitride (BN) crucible and heated at 1800° C. under a nitrogen atmosphere having an atmospheric pressure of 7.5 for 2 hours. The sintered material was taken out from the crucible and cracked in the agate mortar. The cracked and sintered material was again put in the crucible and heated at 1800° C. for 2 hours. The series of processes of taking out, cracking, and heating the powder was repeated further twice to obtain the luminescent material of Example 1.

The obtained luminescent material was powder with yellow body color. When it was excited with black light, yellow emission was confirmed.

Figure 4:
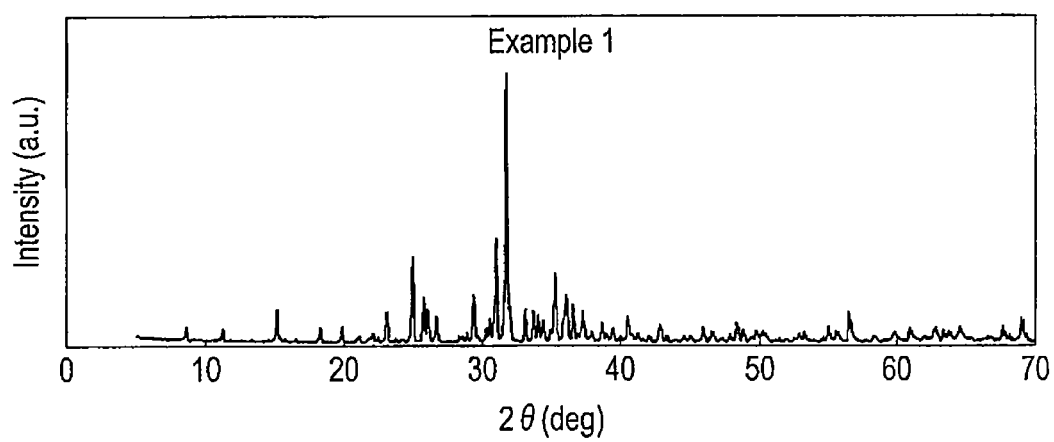
FIG. 4 shows an XRD pattern of the luminescent material of Example 1.
Figure 7:
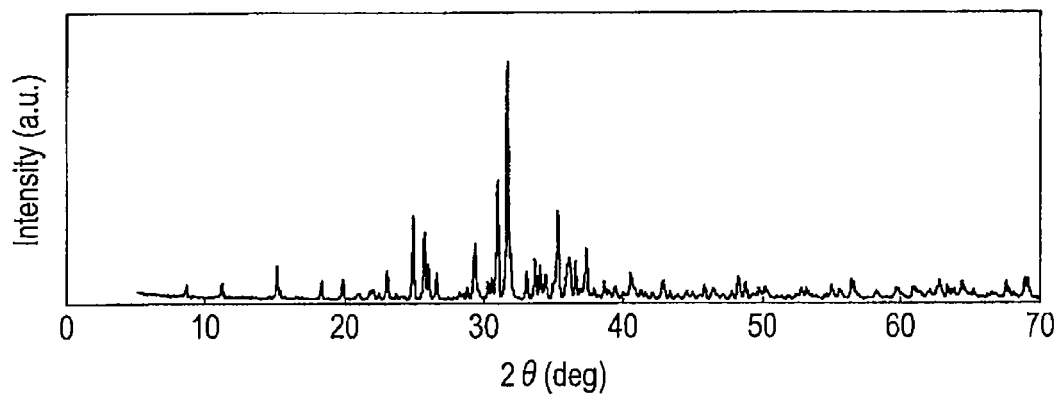
FIG. 7 shows an XRD pattern of the luminescent material of Example 2.
Figure 8:
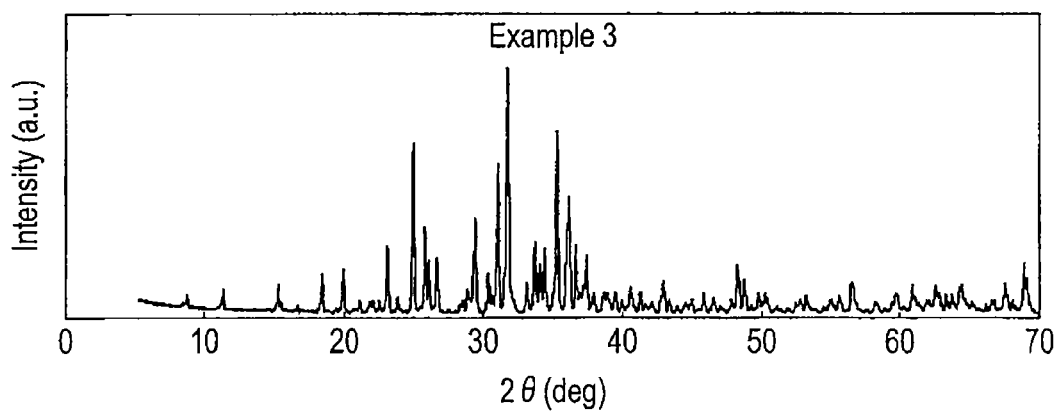
FIG. 8 shows an XRD pattern of the luminescent material of Example 3.

The XRD pattern of the luminescent material is shown in FIG. 4. The XRD pattern herein is determined based on X-ray diffraction by the Bragg-Brendano method using Cu—Kα line. As shown in FIG. 4, peaks appear at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6.

Relative intensities of the peaks shown in FIG. 4 are summarized in Table 2 below.

TABLE 2

| 2θ(deg) | Example 1 |
|---|---|
| 15.05-15.15 | 13 |
| 23.03-23.13 | 12 |
| 24.87-24.97 | 30 |
| 25.7-25.8 | 16 |
| 25.97-26.07 | 13 |
| 29.33-29.43 | 18 |
| 30.92-31.02 | 39 |
| 31.65-31.75 | 100 |
| 31.88-31.98 | 14 |
| 33.02-33.12 | 13 |
| 33.59-33.69 | 12 |
| 34.35-34.45 | 9 |
| 35.2-35.3 | 26 |
| 36.02-36.12 | 18 |
| 36.55-36.65 | 15 |
| 37.3-37.4 | 12 |
| 56.5-56.6 | 12 |

Luminescent emission spectra when the luminescent material was excited with light dispersed at an emission wavelength of 450 nm from a xenon lamp are shown in FIG. 5. In FIG. 5, an emission with a narrow half width near 450 nm is reflection of excitation light and is not luminescence of the luminescent material. A high luminescence intensity having a peak wavelength of 551 nm was confirmed. The half width calculated with an instant multichannel spectrometer was 117 nm. The half width is one of the indicators for color rendering properties of white light generated from the light-emitting device. Generally, as the half width is wider, white light excellent in color rendering properties is easily obtained. Since the half width is 117 nm, it is suggested that white light excellent in color rendering properties is easily obtained by using the luminescent material of Example 1.

FIG. 6 shows temperature property of the luminescent material. The temperature property was determined as follows. The luminescent material is heated by a heater and the luminescence intensity ($I_T$) at a predetermined temperature of T° C. was obtained. The instant multichannel spectrometer was used to measure the luminescence intensity. The luminescence intensity ($I_{25}$) at 25° C. was used and calculated from the formula of $(I_T/I_{25})\times100$. As shown in FIG. 6, it is found that intensity retention of 0.88 or more is obtained at 150° C. and a decrease in the luminescence intensity is low even if the temperature is increased.

The light-emitting device with the structure shown in FIG. 3 was produced using the luminescent material of this example.

As the heat-dissipative insulation substrate 201, an AlN substrate having a square of 8 mm in which p and n electrodes (not shown) were formed in a predetermined region was prepared. As the light-emitting element 202, a light emitting diode having an emission peak in a wavelength of 460 nm was joined to the substrate with solder. One of the electrodes in the light-emitting element 202 was formed on the bottom surface and was electrically connected with the n electrode of the AlN substrate 201. The other electrode in the light-emitting element 202 was connected, through a gold wire 203, with the p electrode (not shown) on an AlN substrate 201.

The inside transparent resin layer 204, the luminous layer 205, and the outside transparent resin layer 206 were sequentially formed into a dome shape on the light-emitting element 202 and a light-emitting device of this example was produced. Silicone resin was used as the material of the inside transparent resin layer 204 and the layer was formed with a dispenser. Transparent resin containing 50% by mass of the luminescent material of this example was used to form the luminous layer 205. The used transparent resin is silicone resin. Further, the same silicone resin as the case of the inside transparent resin layer 204 was used to form the outside transparent resin layer 206 on the luminous layer 205.

When the light-emitting device was placed in an integrating sphere and driven at 20 mA and 3.3 V, the color temperature was 6300 K, the luminous efficiency was 180 lm/W, and Ra was equal to 76. The color temperature, luminous efficiency, and Ra were obtained from the instant multichannel spectrometer.

A white light-emitting device of this example was obtained by combining the luminescent material of this example with a blue LED having an emission peak in a wavelength of 460 nm. The use of the white light-emitting device allows for the formation of a white LED for high power application having a high luminescent efficiency and high color rendering properties.

Luminescent materials of Examples 2 to 17 and Comparative examples 1 and 2 were obtained in the same procedure as described in Example 1 except that the raw material and the blending mass were changed as shown in Tables 3 and 4 below.

TABLE 3

| Example number | Mass (g) | | | | |
|---|---|---|---|---|---|
| | $Sr_3N_2$ | $CeO_2$ | $Si_3N_4$ | $Al_2O_3$ | AlN |
| 1 | 2.680 | 0.147 | 5.086 | 0.000 | 1.691 |
| 2 | 2.625 | 0.245 | 5.086 | 0.000 | 1.691 |
| 3 | 2.487 | 0.491 | 5.086 | 0.000 | 1.691 |
| 4 | 2.708 | 0.098 | 5.086 | 0.000 | 1.691 |
| 5 | 2.680 | 0.147 | 5.086 | 0.000 | 1.691 |
| 6 | 2.680 | 0.147 | 5.262 | 0.449 | 1.537 |
| 7 | 2.821 | 0.155 | 4.911 | 0.000 | 1.484 |
| 8 | 2.736 | 0.049 | 5.086 | 0.000 | 1.691 |
| 9 | 2.708 | 0.098 | 4.911 | 0.000 | 1.844 |
| 10 | 2.565 | 0.093 | 5.086 | 0.000 | 1.691 |
| 11 | 2.851 | 0.103 | 5.086 | 0.000 | 1.691 |
| 12 | 3.136 | 0.114 | 5.086 | 0.000 | 1.691 |
| 13 | 2.708 | 0.098 | 4.911 | 0.255 | 1.640 |
| 17 | 2.653 | 0.098 | 5.086 | 0.000 | 1.691 |
| Comparative Example 1 | 2.708 | 0.098 | 5.612 | 0.000 | 1.230 |
| Comparative Example 2 | 2.821 | 0.155 | 4.560 | 0.765 | 1.537 |

TABLE 4

| Example number | Mass (g) | | | | | | | |
|---|---|---|---|---|---|---|---|---|
| | $Sr_3N_2$ | $Ca_3N_2$ | $Ba_3N_2$ | $Mg_3N_2$ | $CeO_2$ | $Si_3N_4$ | $Al_2O_3$ | AlN |
| 14 | 2.573 | 0.073 | — | — | 0.098 | 5.086 | 0.000 | 1.691 |
| 15 | 2.573 | — | 0.216 | — | 0.098 | 5.086 | 0.000 | 1.691 |
| 16 | 2.573 | — | — | 0.049 | 0.098 | 5.086 | 0.000 | 1.691 |

The luminescent materials in Examples 2 to 17 were powder with yellow body color. When they were excited with black light, yellow luminescence was confirmed. The XRD patterns of these luminescent materials are sequentially shown in FIGS. 7 to 22. Ten peaks selected from the XRD patterns in descending order of intensity were identified as the strongest peak. The diffraction angles (2θ) were indicated by "○" in Tables 5 and 6.

TABLE 5

| 2θ(deg) | Example number | | | | | | | |
|---|---|---|---|---|---|---|---|---|
| | 2 | 3 | 4 | 5 | 6 | 7 | 8 | 9 |
| 15.05-15.15 | — | — | — | — | — | — | — | — |
| 23.03-23.13 | — | ○ | ○ | — | — | ○ | — | ○ |
| 24.87-24.97 | ○ | ○ | ○ | ○ | ○ | ○ | ○ | ○ |
| 25.7-25.8 | ○ | ○ | ○ | ○ | ○ | — | — | — |
| 25.97-26.07 | — | — | — | — | — | — | ○ | ○ |
| 29.33-29.43 | ○ | ○ | ○ | ○ | ○ | ○ | ○ | ○ |
| 30.92-31.02 | ○ | ○ | ○ | ○ | ○ | ○ | ○ | ○ |
| 31.65-31.75 | ○ | ○ | ○ | ○ | ○ | ○ | ○ | ○ |
| 31.88-31.98 | ○ | — | — | — | — | — | — | — |
| 33.02-33.12 | — | — | — | — | — | — | ○ | — |
| 33.59-33.69 | ○ | ○ | ○ | ○ | ○ | ○ | ○ | — |
| 34.35-34.45 | — | ○ | — | ○ | — | ○ | — | ○ |
| 35.2-35.3 | ○ | ○ | ○ | ○ | ○ | ○ | ○ | ○ |
| 36.02-36.12 | ○ | ○ | ○ | ○ | ○ | ○ | ○ | ○ |
| 36.55-36.65 | — | — | ○ | ○ | ○ | ○ | ○ | ○ |
| 37.3-37.4 | ○ | — | — | — | ○ | — | — | — |
| 56.5-56.6 | — | — | — | — | — | — | — | — |

TABLE 6

| 2θ(deg) | Example number | | | | | | | |
|---|---|---|---|---|---|---|---|---|
| | 10 | 11 | 12 | 13 | 14 | 15 | 16 | 17 |
| 15.05-15.15 | — | — | ○ | — | ○ | — | — | — |
| 23.03-23.13 | — | ○ | ○ | ○ | — | ○ | — | — |
| 24.87-24.97 | ○ | ○ | ○ | ○ | ○ | ○ | ○ | ○ |
| 25.7-25.8 | ○ | — | — | — | ○ | ○ | ○ | ○ |
| 25.97-26.07 | — | — | — | — | — | — | — | — |
| 29.33-29.43 | ○ | ○ | ○ | ○ | ○ | ○ | ○ | ○ |
| 30.92-31.02 | ○ | ○ | ○ | ○ | ○ | ○ | ○ | ○ |
| 31.65-31.75 | ○ | ○ | ○ | ○ | ○ | ○ | ○ | ○ |
| 31.88-31.98 | ○ | — | — | — | — | — | — | ○ |
| 33.02-33.12 | — | ○ | — | — | — | — | — | — |
| 33.59-33.69 | ○ | — | ○ | ○ | ○ | ○ | ○ | ○ |
| 34.35-34.45 | — | — | — | ○ | — | — | — | — |
| 35.2-35.3 | ○ | ○ | ○ | ○ | ○ | ○ | ○ | ○ |
| 36.02-36.12 | ○ | ○ | ○ | ○ | ○ | ○ | ○ | ○ |
| 36.55-36.65 | — | — | ○ | ○ | ○ | — | ○ | — |
| 37.3-37.4 | ○ | — | — | — | — | ○ | ○ | ○ |
| 56.5-56.6 | — | ○ | — | — | — | — | — | — |

In any of the luminescent materials in the examples, it is found that ten strongest peaks belong to any of diffraction angles (2θ) of 15.05-15.15°, 23.03-23.13°, 24.87-24.97°, 25.7-25.8°, 25.97-26.07°, 29.33-29.43°, 30.92-31.02°, 31.65-31.75°, 31.88-31.98°, 33.02-33.12°, 33.59-33.69°, 34.35-34.45°, 35.2-35.3°, 36.02-36.12°, 36.55-36.65°, 37.3-37.4°, and 56.5-56.6°.

Luminescence property as for the luminescent materials of Examples 2 to 17 and the luminescent materials of Comparative examples 1 and 2 were examined in the same manner as described above. The results are summarized in Table 7 below together with luminescence property of the luminescent material of Example 1. The intensity in Table 7 shows the relative intensity when the emission intensity of Example 1 is defined as 1. The chromaticity (Cx.Cy) was obtained with an integrating sphere type total luminous analyzer.

TABLE 7

| | Luminous wavelength (nm) | Relative intensity (a.u.) | Luminous half width (nm) | Chromaticity Cx | Cy |
|---|---|---|---|---|---|
| Example 1 | 551 | 1.00 | 117 | 0.433 | 0.538 |
| Example 2 | 555 | 0.94 | 117 | 0.438 | 0.536 |
| Example 3 | 550 | 0.87 | 122 | 0.433 | 0.536 |
| Example 4 | 549 | 1.03 | 117 | 0.426 | 0.541 |
| Example 5 | 550 | 0.94 | 119 | 0.433 | 0.537 |
| Example 6 | 551 | 0.93 | 119 | 0.432 | 0.538 |
| Example 7 | 545 | 1.00 | 117 | 0.405 | 0.547 |
| Example 8 | 549 | 0.93 | 119 | 0.414 | 0.544 |
| Example 9 | 547 | 1.03 | 118 | 0.423 | 0.542 |
| Example 10 | 548 | 0.89 | 119 | 0.421 | 0.542 |
| Example 11 | 549 | 1.14 | 116 | 0.425 | 0.543 |
| Example 12 | 551 | 0.91 | 122 | 0.430 | 0.536 |
| Example 13 | 544 | 0.96 | 118 | 0.402 | 0.547 |
| Example 14 | 549 | 1.01 | 117 | 0.423 | 0.542 |
| Example 15 | 549 | 0.90 | 117 | 0.423 | 0.542 |
| Example 16 | 547 | 0.85 | 120 | 0.419 | 0.541 |
| Example 17 | 546 | 0.95 | 117 | 0.422 | 0.543 |
| Comparative Example 1 | 551 | 0.52 | 121 | 0.415 | 0.541 |
| Comparative Example 2 | 540 | 0.32 | 124 | 0.392 | 0.543 |

As shown in Table 7 above, the luminescent materials of Examples 1 to 17 had a luminescence peak in a wavelength ranging from 544 to 555 nm, and a high luminescence intensity of 0.85 or more was obtained. Furthermore, a wide luminescence with a luminescence emission half width of 116 nm or more was obtained. On the other hand, the luminescent materials of Comparative examples 1 to 2 had a luminescence intensity of 0.32 to 0.52 and sufficient brightness was not obtained.

As for the luminescent materials of Examples 2 to 17, temperature property was examined by the same procedure as described above. It was confirmed that all the luminescent materials of Examples 2 to 17 had intensity retention of 0.81 or more at 150° C. and had good temperature property, similarly to the case of Example 1. Some of the results are shown in Table 8 below and FIG. 23.

TABLE 8

| | Intensity retention @150° C. |
|---|---|
| Example 1 | 0.88 |
| Example 2 | 0.84 |
| Example 3 | 0.81 |
| Example 4 | 0.89 |
| Example 5 | 0.86 |
| Example 6 | 0.87 |
| Example 7 | 0.91 |
| Example 11 | 0.91 |

The results, when chemical analysis by inductively coupled plasma (ICP) was performed on the luminescent materials of Examples 1 to 17 and Comparative examples 1 to 2, are summarized in Table 9 below. The numerical values shown in Table 9 are molar ratios obtained by setting the sum of the Al amount and the Si amount to 10 and standardizing the amounts of the analyzed elements.

TABLE 9

| Example number | Sr | Ca | Ba | Mg | Ce | x | y | Al (z) | Si (10 − z) | O (u) | N (w) | Al − O (z − u) | O + N (u + w) |
|---|---|---|---|---|---|---|---|---|---|---|---|---|---|
| 1 | 1.79 | — | — | — | 0.058 | 0.031 | 0.93 | 2.76 | 7.24 | 0.55 | 12.81 | 2.21 | 13.37 |
| 2 | 1.76 | — | — | — | 0.096 | 0.052 | 0.93 | 2.78 | 7.22 | 0.61 | 12.88 | 2.17 | 13.48 |
| 3 | 1.69 | — | — | — | 0.195 | 0.104 | 0.94 | 2.79 | 7.21 | 0.77 | 13.08 | 2.03 | 13.85 |
| 4 | 1.83 | — | — | — | 0.038 | 0.020 | 0.93 | 2.83 | 7.17 | 0.51 | 12.88 | 2.32 | 13.38 |
| 5 | 1.80 | — | — | — | 0.059 | 0.032 | 0.93 | 2.81 | 7.19 | 0.56 | 13.01 | 2.24 | 13.57 |
| 6 | 1.81 | — | — | — | 0.059 | 0.031 | 0.94 | 2.58 | 7.42 | 0.56 | 13.04 | 2.02 | 13.61 |
| 7 | 1.83 | — | — | — | 0.061 | 0.032 | 0.95 | 3.23 | 6.77 | 0.97 | 12.47 | 2.26 | 13.44 |
| 8 | 1.85 | — | — | — | 0.018 | 0.010 | 0.94 | 2.81 | 7.19 | 0.52 | 13.54 | 2.29 | 14.06 |
| 9 | 1.81 | — | — | — | 0.038 | 0.021 | 0.92 | 3.08 | 6.92 | 0.51 | 13.33 | 2.56 | 13.85 |
| 10 | 1.74 | — | — | — | 0.039 | 0.022 | 0.89 | 2.80 | 7.20 | 0.64 | 13.11 | 2.16 | 13.75 |
| 11 | 1.92 | — | — | — | 0.042 | 0.021 | 0.98 | 2.81 | 7.19 | 0.65 | 13.28 | 2.16 | 13.93 |
| 12 | 2.05 | — | — | — | 0.045 | 0.021 | 1.05 | 2.83 | 7.17 | 0.68 | 13.39 | 2.15 | 14.07 |
| 13 | 1.84 | — | — | — | 0.036 | 0.019 | 0.94 | 3.04 | 6.96 | 0.95 | 12.89 | 2.09 | 13.84 |
| 14 | 1.71 | 0.096 | — | — | 0.038 | 0.021 | 0.87 | 2.76 | 7.24 | 0.64 | 13.04 | 2.12 | 13.68 |
| 15 | 1.72 | — | 0.077 | — | 0.038 | 0.021 | 0.88 | 2.81 | 7.19 | 0.61 | 13.01 | 2.19 | 13.62 |
| 16 | 1.74 | — | — | 0.010 | 0.041 | 0.023 | 0.89 | 2.81 | 7.19 | 0.61 | 13.01 | 2.19 | 13.62 |
| 17 | 1.77 | — | — | — | 0.038 | 0.021 | 0.90 | 2.78 | 7.22 | 0.58 | 12.91 | 2.20 | 13.49 |
| Comparative Example 1 | 1.83 | — | — | — | 0.039 | 0.021 | 0.94 | 2.07 | 7.93 | 0.66 | 13.66 | 1.41 | 14.32 |
| Comparative Example 2 | 1.90 | — | — | — | 0.060 | 0.031 | 0.98 | 3.56 | 6.44 | 2.17 | 12.04 | 1.39 | 14.21 | x, y, z, u, and w in Table 9 above correspond to x, y, z, u, and w in Formula 1 below.

$$(M_{1-x}Ce_x)_{2y}Al_zSi_{10-z}O_uN_w \quad \text{Formula 1}$$

As shown in Table 9 above, in any of the luminescent materials of Examples 1 to 17, x, y, z, u, and w are within the following range:

0<x≤1, 0.8≤y≤1.1, 2≤z≤3.5, u≤1
1.8≤z−u, 13≤u+w≤15

Since the luminescent material of the example has a predetermined composition, it can produce yellow luminescence with a wide luminescence emission spectrum half width with high efficiency and has good temperature property. On the other hand, in Comparative example 1 in which sufficient brightness is not obtained, z−u is as small as 1.39 to 1.41. Further, in Comparative example 2, z is as large as 3.56 and u is as large as 2.17.

Subsequently, as the luminescent material of Comparative example 3, a commercially available Eu activated orthosilicate luminescent material was prepared.

Luminescent materials of Comparative examples 4 to 11 were synthesized with the same composition as the luminescent material of Example 1 except that each of the following compositions in Formula 1 was changed as shown in Table 10 below.

TABLE 10

| | Changed composition |
| --- | --- |
| Comparative Example 4 | y < 0.8 |
| Comparative Example 5 | y > 1.1 |
| Comparative Example 6 | z < 2 |
| Comparative Example 7 | z > 3.5 |
| Comparative Example 8 | u > 1 |
| Comparative Example 9 | z − u < 1.8 |
| Comparative Example 10 | u + w < 13 |
| Comparative Example 11 | 15 < u + w |

The XRD patterns of the luminescent materials of Comparative examples 3 to 11 were determined in the same manner as described above. As a result, in the luminescent materials of these comparative examples, a peak did not always appear at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6.

Further, the luminescent materials of Comparative examples 3 to 11 were excited by emitting light with a wavelength of 450 nm in the same manner as described above. The luminescence property was examined and temperature property of each luminescent material was determined. It was confirmed that all the luminescent materials of Comparative examples could not combine luminescence property and temperature property.

Specifically, the Eu-activated orthosilicate luminescent material (Comparative example 3) has a half width as narrow as about 70 nm. Even if the luminescent material is combined with a blue light-emitting diode, a light-emitting device having good color-rendering properties is not obtained. Additionally, a decrease in luminance at high temperatures is significant. In the case of a high output light-emitting device with a power supply of about 300 mW or more, the efficiency is reduced.

When the y value in Formula 1 is less than 0.8 (Comparative example 4), the amount of Sr+Ce is too small and the crystallinity is reduced, resulting in low efficiency. On the other hand, when the y value exceeds 1.1 (Comparative example 5), the amount of Sr+Ce is too large and an excessive amount of Sr+Ce forms a heterophase, resulting in low efficiency.

When the z value in Formula 1 is less than 2 (Comparative example 6), the amount of Al is too small. Thus, the crystal structure is not maintained and converted to a different crystal structure, resulting in insufficient characteristics. On the other hand, when the z value exceeds 3.5 (Comparative example 7), the amount of Al is too large and the crystal structure is converted to a different crystal structure containing an excessive amount of Al, resulting in insufficient characteristics.

When the u value in Formula 1 is 1 or more (Comparative example 8), the amount of O is too large. Thus, covalent bonding properties are reduced, the wavelength becomes short, and the efficiency becomes low, resulting in insufficient temperature property. On the other hand, when the z−u value is less than 1.8 (Comparative example 9), the amount of O is too large as compared to Al, and the crystal structure is not maintained and converted to a different crystal structure. Thus, desired characteristics are not obtained.

When the u+w value in Formula 1 is less than 13 (Comparative example 10), the amount of anions is too small and the charge balance is destroyed. Thus, the crystal structure is not maintained and converted to a different crystal structure, resulting in insufficient characteristics. On the other hand, when the u+w value exceeds 15 (Comparative example 11), the amount of anions is too large and the charge balance is destroyed. Thus, the crystal structure is not maintained and converted to a different crystal structure, resulting in insufficient characteristics.

According to the embodiments of the present invention, there is provided a luminescent material which has good temperature property and can emit yellow light with a wide luminescence emission spectrum half width with high efficiency. The combination of the yellow-emitting luminescent material of this embodiment with blue LED enables a white light-emitting device having excellent color rendering properties and good luminescence property to be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A luminescent material which exhibits a luminescence peak in a wavelength ranging from 544 to 562 nm when excited with light having an emission peak in a wavelength ranging from 250 to 500 nm, the luminescent material having a composition represented by Formula 1 below:

$$(M_{1-x}Ce_x)_{2y}Al_zSi_{10-z}O_uN_w \quad \text{Formula 1}$$

wherein M represents Sr and a part of Sr may be substituted by at least one selected from Ba, Ca, and Mg; x, y, z, u, and w satisfy following conditions:
0<x≤1, 0.8≤y≤1.1, 2≤z≤3.5, u≤1,
1.8≤z−u, and 13≤u+w≤15,
and wherein a crystal of the luminescent material has an orthorhombic system and belongs to a space group Pna2$_1$.

2. The luminescent material according to claim 1, wherein the luminescent material has at least ten peaks at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6 in X-ray diffraction by the Bragg-Brendano method using Cu—Kα line.

3. The luminescent material according to claim 1, wherein x is from 0.001 to 0.5.

4. The luminescent material according to claim 1, wherein y is from 0.85 to 1.06.

5. The luminescent material according to claim 1, wherein z is from 2.5 to 3.3.

6. The luminescent material according to claim 1, wherein u is from 0.001 to 0.8.

7. The luminescent material according to claim 1, wherein z–u is 2 or more.

8. The luminescent material according to claim 1, wherein u+w is from 13.2 to 14.2.

9. The luminescent material according to claim 1, wherein 15 at % or less of Ce is replaced with another element.

10. The luminescent material according to claim 9, wherein another element is selected from the group consisting of Tb, Eu, and Mn.

11. A light-emitting device comprising:
  a light-emitting element which emits light having an emission peak in a wavelength ranging from 250 to 500 nm; and
  a luminous layer comprising a luminescent material which emits yellow light by receiving light from the light-emitting element, the luminescent material which emits yellow light comprising the luminescent material of to claim 1.

12. The light-emitting device according to claim 11, further comprising:
  a heat-dissipative insulation substrate on which the light-emitting element is placed,
  wherein the luminous layer is dome-shaped.

13. The light-emitting device according to claim 12, further comprising:
  an inside transparent resin layer placed inside the luminous layer, and
  an outside transparent resin layer placed outside the luminous layer.

14. The light-emitting device according to claim 11, wherein the luminous layer further comprises at least one selected from the group consisting of a luminescent material which emits green light by excitation with blue light and a luminescent material which emits red light by excitation with blue light.

15. The light-emitting device according to claim 11, wherein the light-emitting element emits ultraviolet ray having a peak in a wavelength ranging from 250 to 400 nm and the luminous layer further comprises a luminescent material which emits blue light by excitation with ultraviolet ray.

16. The light-emitting device according to claim 15, wherein the fluorescent-emitting layer further comprises at least one selected from the group consisting of a luminescent material which emits red light by excitation with ultraviolet ray and a luminescent material which emits green light by excitation with ultraviolet ray.

17. A method for manufacturing a luminescent material of claim 1, comprising:
  mixing an M raw material selected from nitrides and carbides of M, an Al raw material selected from nitrides, oxides, and carbides of Al, an Si raw material selected from nitrides, oxides, and carbides of Si, and a Ce raw material selected from oxides, nitrides, and carbonates of Ce to obtain a mixture; and
  heating the mixture under 5 atmospheres or more at 1500 to 2000° C.

18. The method according to claim 17, wherein the mixture is heated in a nitrogen atmosphere.

19. The luminescent material according to claim 1, wherein the luminescent material exhibits a luminescence peak in a wavelength ranging from 544 to 555 nm when excited with light having an emission peak in a wavelength ranging from 250 to 500 nm.

* * * * *